(12) United States Patent
Voronin et al.

(10) Patent No.: US 10,204,832 B2
(45) Date of Patent: Feb. 12, 2019

(54) METHOD OF PATTERNING INTERSECTING STRUCTURES

(71) Applicant: Tokyo Electron Limited, Tokyo (JP)

(72) Inventors: Sergey A. Voronin, Glenmont, NY (US); Christopher Talone, Slingerlands, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/708,319

(22) Filed: Sep. 19, 2017

(65) Prior Publication Data

US 2018/0082903 A1 Mar. 22, 2018

Related U.S. Application Data

(60) Provisional application No. 62/397,779, filed on Sep. 21, 2016.

(51) Int. Cl.
| | |
|---|---|
| *H01L 21/8234* | (2006.01) |
| *H01L 21/3065* | (2006.01) |
| *H01L 21/67* | (2006.01) |
| *H01L 21/66* | (2006.01) |

(Continued)

(52) U.S. Cl.
CPC ............ *H01L 21/823431* (2013.01); *H01L 21/02057* (2013.01); *H01L 21/3065* (2013.01); *H01L 21/67069* (2013.01); *H01L 21/67253* (2013.01); *H01L 22/26* (2013.01); *H01L 29/66795* (2013.01)

(58) Field of Classification Search
None
See application file for complete search history.

(56) References Cited

U.S. PATENT DOCUMENTS

| 6,699,399 B1 | 3/2004 | Qian et al. |
| 8,288,263 B2 | 10/2012 | Kim et al. |
| 9,443,731 B1 | 9/2016 | O'Meara et al. |
| (Continued) | | |

FOREIGN PATENT DOCUMENTS

| KR | 2011-0121360 A | 11/2011 |
| WO | 2016133673 A1 | 8/2016 |

OTHER PUBLICATIONS

International Searching Authority, Search Report and Written Opinion issued in counterpart International Appl. No. PCT/US2017/052190 dated Jan. 11, 2018, 10 pp.

*Primary Examiner* — Asok K Sarkar
(74) *Attorney, Agent, or Firm* — Wood Herron & Evans LLP

(57) ABSTRACT

Provided is a method of patterning structures on a substrate using an integration scheme in a patterning system, the method comprising: disposing a substrate in a processing chamber, the substrate having a plurality of structures and a pattern, the substrate including an underlying layer and a target layer, at least one structure intersecting with another structure, each intersection having an intersection angle and a corner, the integration scheme requiring a vertical corner profile at each intersection; alternatingly and sequentially etching and cleaning the substrate to transfer the pattern onto the target layer and to achieve a target vertical corner profile at each intersection; controlling selected two or more operating variables of the integration scheme in the alternating and sequential etching and cleaning operations in order to achieve target integration objectives.

19 Claims, 10 Drawing Sheets

(51) Int. Cl.
*H01L 21/02* (2006.01)
*H01L 29/66* (2006.01)

(56) References Cited

U.S. PATENT DOCUMENTS

| | | |
|---|---|---|
| 2013/0164911 A1 | 6/2013 | Ito et al. |
| 2014/0302678 A1 | 10/2014 | Paterson et al. |
| 2015/0255298 A1 | 9/2015 | Darling et al. |

# METHOD OF PATTERNING INTERSECTING STRUCTURES

CROSS-REFERENCE TO RELATED APPLICATIONS

The present application claims the benefit of U.S. Provisional Patent Application No. 62/397,779, filed on Sep. 21, 2016, entitled "Method of Patterning Intersecting Structures," which is incorporated herein by reference in its entirety.

BACKGROUND OF THE INVENTION

Field of Invention

The invention relates to a method for semiconductor patterning and specifically to enhance corner residue removal and achieve a vertical profile target in etching of intersecting patterns.

Description of Related Art

The presence of non-volatile by-products or residue in intersecting patterns affects the performance of patterned devices. For example, the presence of silicon residue in a gate module after silicon gate etching can change technical characteristics of the device or result in failure of the device.

Selective etching of silicon requires the use of, for example, hydrogen bromide, HBr, plasmas. Other combination of gases may also be used. Reaction between Si, oxygen and Br can result in generation of large amounts of non-volatile by-product in the form of $SiBr_xO_y$. The $SiBr_xO_y$ is also accumulated on the process chamber walls and desorbs to the gas phase and re-deposits on the substrate. This results in partial reduction of physical transparency for the reactive species. The reactive ion trajectories become limited especially in the substrate features below the mask level, thus etching cannot remove silicon by-product from the corners of intersections. In addition, it is difficult to control the corner profile where the patterns intersect; these typically do not have vertical profiles using current schemes.

The need for corner residue problem solution is very critical for the 10N technological node and beyond. In addition, there is a need for an integration scheme that enable the series of processes to produce a vertical corner profile. Furthermore, there is also a need for a process or series of processes that can perform the physical removal of non-volatile by-product from the substrate surface at the intersection corners. There is also a need for determining the appropriate ranges of operating variables of the integration process of patterning of one or more intersecting structures to achieve integration objectives.

SUMMARY OF THE INVENTION

Embodiments of the invention relate to a method of patterning structures on a substrate using an integration scheme in a patterning system, the method comprising: disposing a substrate in a processing chamber, the substrate having a plurality of structures and a pattern, the substrate including an underlying layer and a target layer, at least one of the structures intersecting with another one of the structures, each intersection having at least one corner, the integration scheme requiring a vertical corner profile at each intersection; alternatingly and sequentially cleaning and etching the substrate to transfer the pattern onto the target layer and to achieve a target vertical corner profile at each intersection; controlling selected two or more operating variables of the integration scheme in the alternating and sequential cleaning and etching processes in order to achieve target integration objectives.

Also provided is method of patterning structures on a substrate using a patterning scheme in a patterning system, the method comprising: disposing a substrate in a processing chamber, the substrate including an underlying layer and a target layer, at least one structure intersecting with another structure, each intersection having an intersection angle and a vertically extending corner, the substrate further including a pattern requiring a vertical corner profile at each intersection; performing breakthrough etch and half-etch processes on the structures on the substrate, the breakthrough etch and half-etch processes causing residue at the corners; performing a plasma cleaning process on the substrate; performing a soft-landing etch process and an overetch process on the substrate; if target integration objectives are not met, adjusting one or more operating variables of the plasma cleaning process and the soft-landing etch and overetch processes and repeating the performance of the plasma cleaning process and the soft-landing etch and overetch processes until the target integration objectives are met.

DETAILED DESCRIPTION OF SEVERAL EMBODIMENTS

Figure 1:
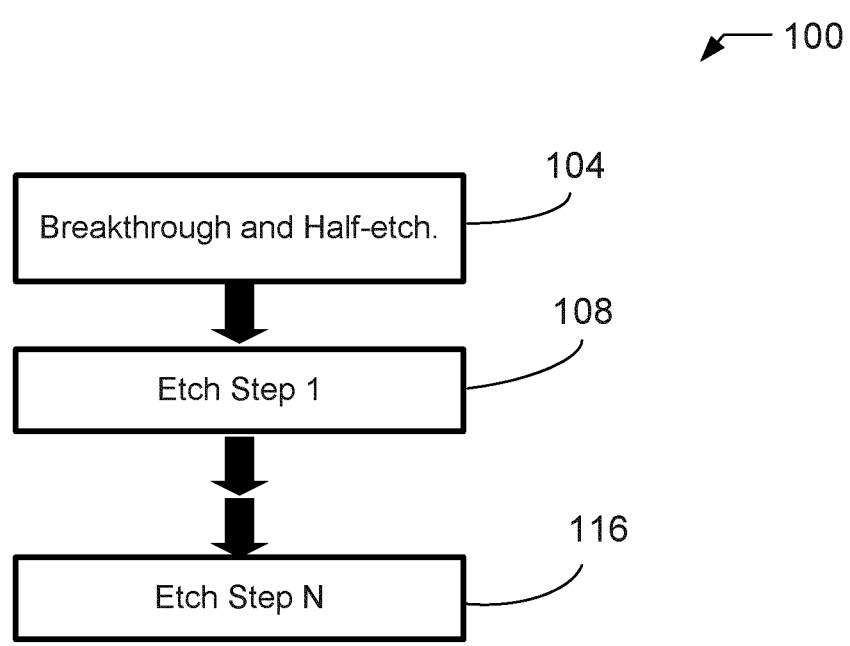
FIG. 1 is an exemplary prior art schematic of operations or steps used to perform gate etching that causes the presence of residue in intersections.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

"Substrate" as used herein generically refers to the object being processed in accordance with the invention. The substrate may include any material portion or structure of a device, particularly a semiconductor or other electronics device, and may, for example, be a base substrate structure, such as a semiconductor substrate or a layer on or overlying a base substrate structure such as a thin film. The substrate may be a conventional silicon substrate or other bulk substrate comprising a layer of semi-conductive material. As used herein, the term "bulk substrate" means and includes not only silicon substrates, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

In the specifications, the terms residue, non-volatile byproduct, and byproduct are used interchangeably.

Referring now to the drawings, wherein like reference numerals designate identical or corresponding parts throughout the several views, Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

FIG. 1 is an exemplary prior art schematic 100 of operations or steps used to perform gate etching which causes the presence of residue in corners of intersections of structures. The breakthrough and half-etch step 104 is a non-selective etch to remove the native oxide from the surface of the substrate. The breakthrough etch and half-etch step is known to people in the art and will not be discussed in detail here. A half-etch or main etch is a highly anisotropic etch step with limited selectivity which removes a significant portion of material being etched. The Etch Step 1 108 can comprise a soft landing etch, and an overetch processes. A soft landing etch is an etching step with high selectivity to oxide or other dielectric such as $Si_3N_4$ and the like as it "lands" on a portion of the patterned structure, in this case, it lands on the fin of the fin-shaped structure. The soft landing etch may have limited anisotropy in the etching process, where the anisotropy is the major difference from the half-etch or main etch step. The overetch step provides highly selective etching during a relatively longer period of time which is required for complete removal of the material being etched. As mentioned above, the aforementioned types of etches are known in the art and will not discussed in detail here. Back to FIG. 1, the silicon etch steps are repeated, continuing until Etch Step N 116 where the amount of residue that can be removed is disposed.

Figure 2A:
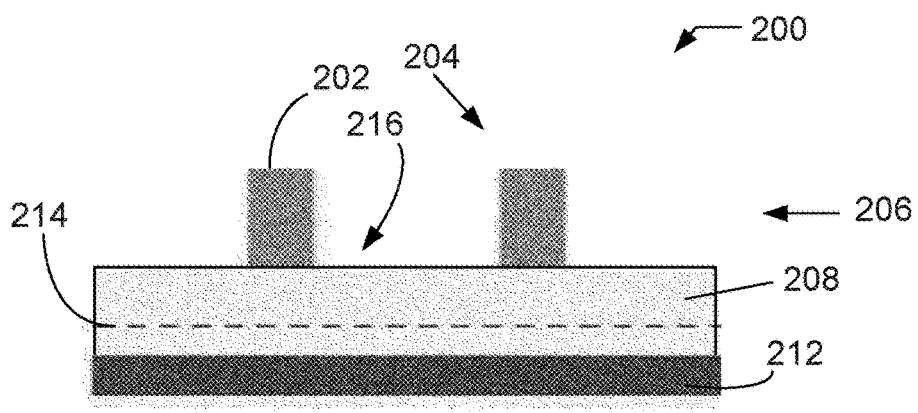
FIG. 2A is an exemplary prior art schematic of an input substrate with a hard mask and fin-shaped structure.

FIG. 2A is an exemplary prior art schematic 200 of an input substrate 204 with a patterned structure 206 comprising a hard mask 202 and fin-shaped structure 214 that forms an intersection 216. The fin-shaped structure 214 can be fin-shaped field effect transistors (FINFET). The input substrate 204 includes the patterned structure 206 and an underlying layer 208, a fin-shaped structure 214 and target transfer layer 212. The input substrate 204 can be a product of a series of previous deposition and etch processes generating the patterned structure 206 and fin-shaped structure 214.

Figure 2B:
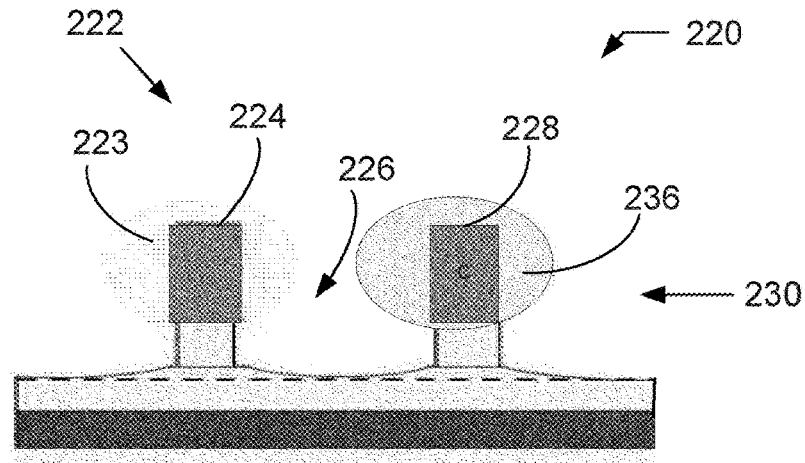
FIG. 2B is an exemplary prior art schematic of the substrate after a break-through etch and half-etch processes.

FIG. 2B is an exemplary prior art schematic 220 of the substrate 222 after break-through etch and half-etch processes. The patterned structure 230 shows the hard masks, 224 and 228, getting a coating of non-volatile byproducts or residue, 223 and 236, comprising a compound including, for example, silicon, bromine, and oxygen represented as $SiBr_xO_y$. The residue, 223 and 236, also accumulates in the process chamber walls (not shown). The residue, 223 and 236, desorbs from the chamber wall, re-dissociates into SiBr highly reactive species in the plasma discharge and adsorbs in form of SiBrO onto the substrate 222, reducing the transparency of the patterned structures 230 at the lower portion of the patterned structures 230 especially below the hardmasks, 224 and 228. As will be discussed more below, the loss of transparency causes an inability of the prior art scheme to obtain the desired pattern profile of intersecting patterns 226 and removal of residue which impact the quality of the intended device.

Figure 2C:
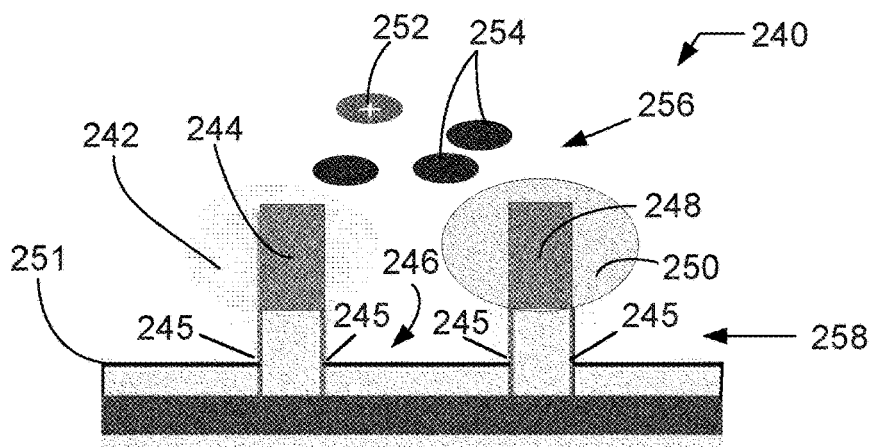
FIG. 2C is an exemplary prior art schematic of a substrate after a soft-landing and overetch processes where reduced transparency causes ineffective corner residue removal.

FIG. 2C is an exemplary prior art schematic 240 of a substrate 256 after soft-landing and over-etch processes where reduced transparency caused ineffective corner residue removal. The patterned structure 258 includes intersections 246, which consist of lines and space, 244 and 248, going into the page and the fins 251 that are parallel to the page. The presence of the coating of residue, 242 and 250, around the top hardmask portion, 244 and 248, of the patterned structures 258 which reduces the physical transparency of the patterned structure 258 in the corners 245 of intersections 246. The trajectory of positive radicals 252 as opposed to neutrals 254 in the plasma would be limited in the case where the coating of residue, 242 and 250, of the hardmask, 244 and 248, blocks a portion of the space to get to the corners 245 of the intersections 246.

Figure 2D:
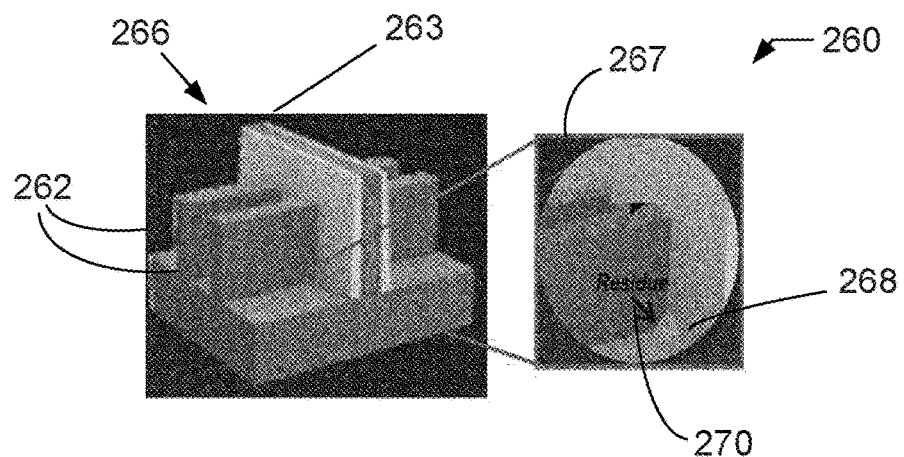
FIG. 2D is an exemplary prior art three-dimensional schematic of a substrate highlighting the presence of byproducts in a corner of intersections of the patterns and a schematic of a corner residue.

FIG. 2D is an exemplary prior art three-dimensional schematic 260 of a substrate 266 depicting the presence of non-volatile byproducts or residue 270 in the corner 268 of intersections of the patterns of line and space 263 (gate or patterned structure) and fin-shaped structure 262. A schematic of a close-up 267 of residue 270 at the corner 268 of the intersections of the patterns of line and space 263 and fin-shaped structure 262 is also shown to highlight the position of and difficulty of reaching the residue 270 at the corner 268. The height of the residue 270 is dwarfed by the relative height of both the fin-shaped structure 262 and the gate or patterned structure 263. The height of the surrounding features including the fin-shaped structure 262 and gate or patterned structure 263 are typically 10-100 times larger than that of the residue 270. The width of the residue 270 is small in comparison to the dimensions of fin-shaped structure 262 and the gate or patterned structure 263, so the aspect ratio to etch a particular residue 270 is very large, causing difficulty in etching the residue 270.

Figure 2E:
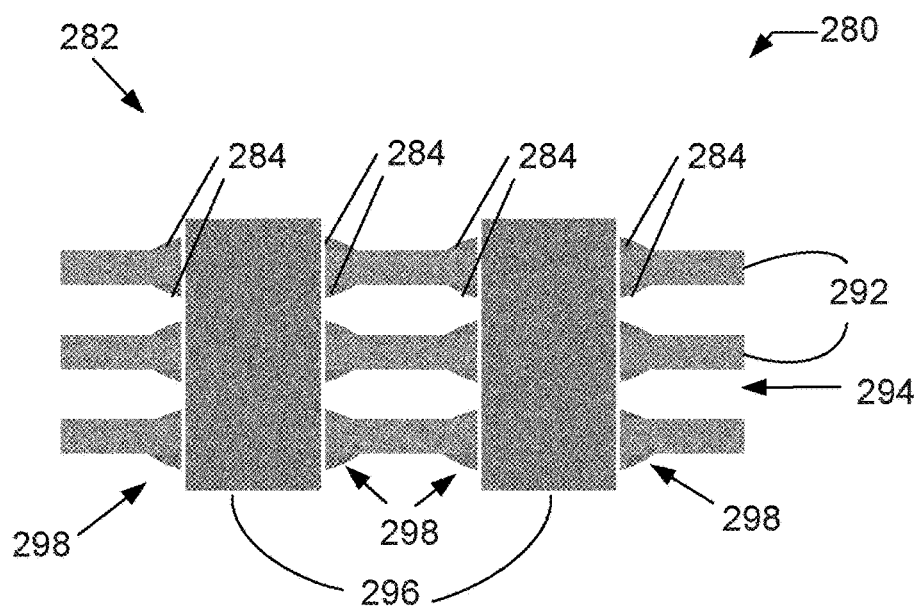
FIG. 2E is an exemplary prior art schematic of a substrate depicting the presence of byproducts in corners of intersections of the patterns.

FIG. 2E is an exemplary prior art top-view schematic 280 of a substrate 282 depicting the presence of byproducts or residues in corners 284, in the lower portions of intersections 298 of the patterned structure 294 comprising a gate structure 296 and a fin-shaped structure 292. FIG. 2E again highlights the difficulty of etching the corners 284 of intersections 298 due to the lack of physical transparency of the corners 284 by the radicals generated by the etching plasma.

Figure 3:
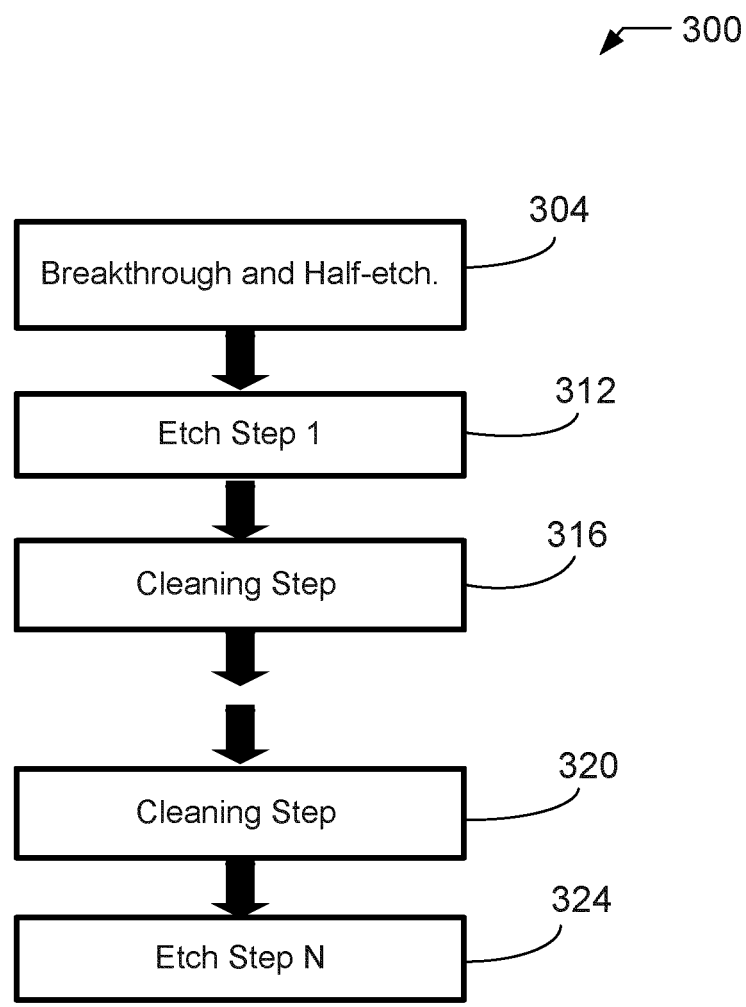
FIG. 3 is an exemplary schematic of operations or steps used to perform gate etching in an embodiment of the present invention.

FIG. 3 is an exemplary schematic flowchart 300 of operations or steps used to perform patterning of intersecting structures in an embodiment of the present invention. The breakthrough and half-etch step 304 comprises a breakthrough etch which is a non-selective etch to remove the native oxide from the surface of the substrate. The half-etch step is a highly anisotropic etch with limited etch selectivity and removes a significant portion of the material being etched. Typical materials used for hard mask etched in the breakthrough etch is silicon dioxide, silicon nitride, and the like. Typical gases used in the breakthrough etch and half-etch include but are not limited to HBr, Cl$_2$, SF$_6$, CF$_4$, CHF$_3$, and/or CH$_3$F. The operating parameters used are source power in a range from 0 to 3,000 W, bias power in a range from 0 to 1,000 W, pressure in a range from 3 mT to 500 mT, and gas flow rates from 1 sccm to 5,000 sccm. The breakthrough etch and half-etch are known to people in the art and will not be discussed in detail here.

The etch step 1 312 can comprise a soft landing etch and an overetch. As mentioned above, a half-etch or main etch is a highly anisotropic etch step with limited selectivity which removes a significant portion of material being etched. A soft landing etch is an etching step with high selectivity to oxide as it "lands" on a portion of the patterned structure, in this case, it lands on the fin of the fin-shaped structure. The soft landing etch may have limited anisotropy in the etching process, where the anisotropy is the major difference from the half-etch step. The gases for the main etch can include one or more of HBr, Cl$_2$, SF$_6$, CF$_4$, CHF$_3$, or CH$_3$F. The soft landing etch may utilize more of the HBr in order to enhance the selectivity. The ranges of operating variables can include a source power in a range of 1 to 3,000 W, bias power in the range from 0 to 1,000 W, pressure in a range from 3 to 500 mT; gas flow rates in a range from 1 sccm to 5,000 sccm.

The cleaning step 316 is a new step inserted between the etch steps, configured to increase physical transparency of the lower portion of the patterned structure to reactive species. The cleaning step can use, for example, a fluorine-based gas including CF$_4$, NF$_3$, SF$_6$, C$_2$F$_6$, C$_3$F$_8$, C$_4$F$_8$, CH$_3$F, CH$_2$F$_2$, HF, XeF$_2$ and CHF$_3$. Other halogen gases such chlorine-based gases may also be used. The gases most frequently used are CF$_4$, NF$_3$, and/or SF$_6$. The operating variables include pressure in a range from 2 mT to 100 mT, the gas flow rates in the range from 5 sccm to 10,000 sccm, and the operating source power in the range from 50 W to 7,000 W. In the etch reaction, SiBr$_x$, SiBr$_4$ for example, forms a volatile SiBr$_4$ which may re-dissociate in the plasma forming SiBr and SiBr$_2$ by-products in the gas phase. These gases reacting with oxygen can result in formation SiBr$_x$O$_y$, films on the surface, where the x and y are non-zeroes. SiBr$_x$ species can include SiBr$_*$, SiBr$_{2*}$, SiBr$_{3*}$, and SiBr$_4$ which are indicated to be the main etch process. The etch process can be characterized by reaction:

$$Si + xBr \rightarrow SiBr_x \quad (1.1)$$

forming the volatile SBr$_4$ which leaves the surface of the substrate in order to perform the etching action. Together with the oxygen from the chamber wall or from erosion of quartz parts of the chamber, the SiBr compound become SiBr$_x$O$_y$, where x<3, which can be redeposited on the corners of intersections of the pattern structures, i.e, the fin-shaped structure and the gate structure, of the substrate. If the gas used is chlorine, the non-volatile compound formed is SiCl$_x$O$_y$, where x and y are non-zeroes.

The etch and cleaning steps are performed iteratively until cleaning step 320 and etch step N 324 which is when the target integration objectives, including a target removal percentage of residue, no residue at gate-fin corners, target by-product redeposition, and/or target corner profile at intersections, are achieved.

Figure 4A:
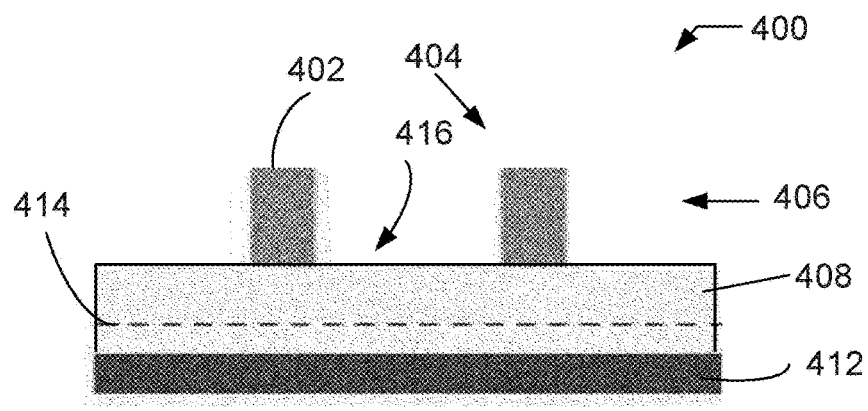
FIG. 4A is an exemplary schematic of an input substrate with a hard mask and a fin-shaped structure in an embodiment of the present invention.

FIG. 4A is an exemplary schematic 400 of an input substrate 404 with a patterned structure 406 comprising a hard mask 402, fin-shaped structure 414, and intersection 416. The input substrate 404 includes the patterned structure 406, an underlying layer 408, a fin-shaped structure 414, and target transfer layer 412. The input substrate 404 can be a product of a series of previous deposition and etch processes generating the patterned structure 406 and fin-shaped structure 414.

Figure 4B:
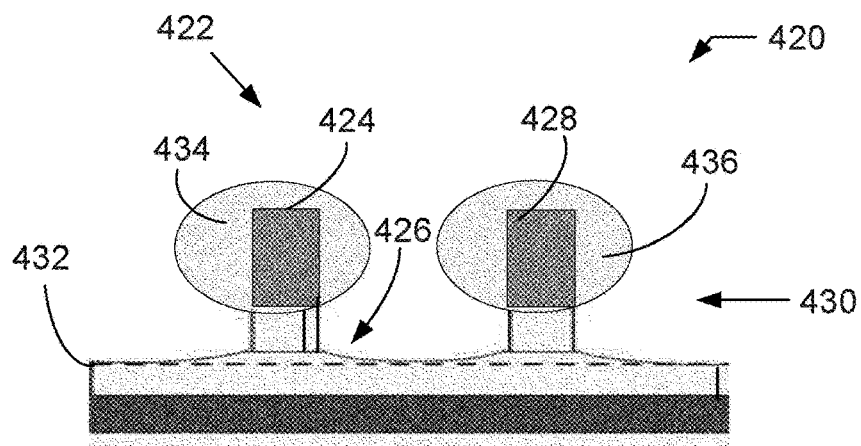
FIG. 4B is an exemplary schematic of the substrate after a break-through etch and half-etch processes in an embodiment of the present invention.

FIG. 4B is an exemplary schematic 420 of the substrate 422 after a break-through etch and half-etch processes. The patterned structure 430 comprising a hard mask, 424 and 428, fin-shaped structure 432, and intersection 426, shows the hard masks, 424 and 428, getting a coating of non-volatile byproducts or residue, 434 and 436. The byproducts can comprise a compound including silicon, bromine, and oxygen represented as SiBrxOy. The residue, 434 and 436, also accumulates in the process chamber walls (not shown). The residue, 434 and 436, desorbs from the chamber walls and redeposits on the substrate, reducing the transparency of the patterned structures 430 at the lower portion of the patterned structures 430 especially below the hardmask, 424 and 428. The loss of transparency can cause an inability to obtain vertical corner profile for intersecting patterns 426 and also leave a certain amount of residue that impacts the quality of the intended device.

Figure 4C:
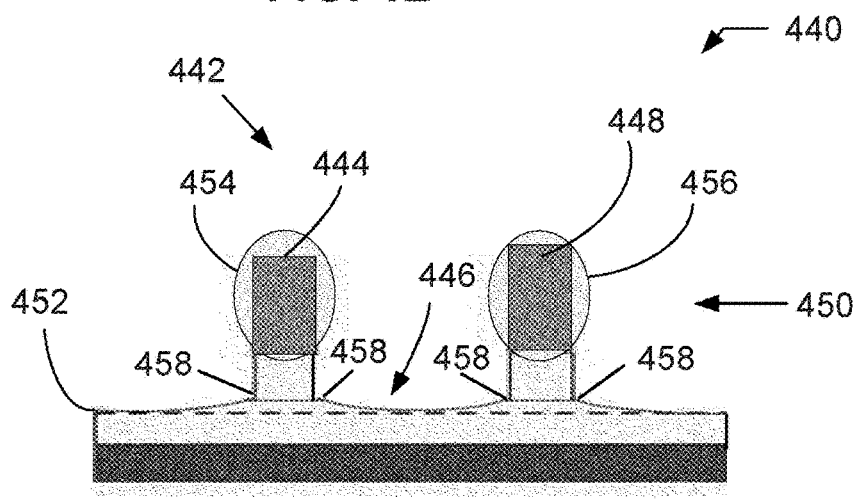
FIG. 4C is an exemplary schematic of a substrate with a patterned structure after a cleaning process in an embodiment of the present invention.

FIG. 4C is an exemplary schematic 440 of a substrate 442 with a patterned structure 450 after a polymer cleaning process in an embodiment of the present invention. The patterned structure 450 shows the fin-shaped structure 452, the hard masks, 444 and 448, and intersection 446, The hard masks has a coating of non-volatile byproducts or residue, 454 and 456, comprising for example, a compound including silicon, bromine, and oxygen represented as $SiBr_xO_y$. If a chlorine-based gas is used, the non-volatile byproduct is $SiCl_xO_y$. In both instances, the x and y are not zeroes. The residue, 454 and 456, also accumulates in the process chamber walls (not shown). Note that after the polymer cleaning process, there is more physical transparency of the portion of the patterned structure 450 below the hard mask, 444 and 448, where the size of the residue around the hard mask, 444 and 448, were smaller compared to the size of the residue, 434 and 436, in FIG. 4B after the breakthrough etch and half-etch. Also, the lesser residue (not shown) is in the corners 458 of the intersection 446.

As mentioned above, the main etch step can comprise a soft landing etch and an overetch. The gases for the main etch can include one or more of HBr, $Cl_2$, $SF_6$, $CF_4$, $CHF_3$, or $CH_3F$. The soft landing etch may utilize more of the HBr in order to enhance the selectivity. The ranges of operating variables can include a source power in a range of 1 to 3,000 W, bias power in the range from 0 to 1,000 W, pressure in a range from 3 to 500 mT; gas flow rates in a range from 1 sccm to 5,000 sccm.

Figure 4D:
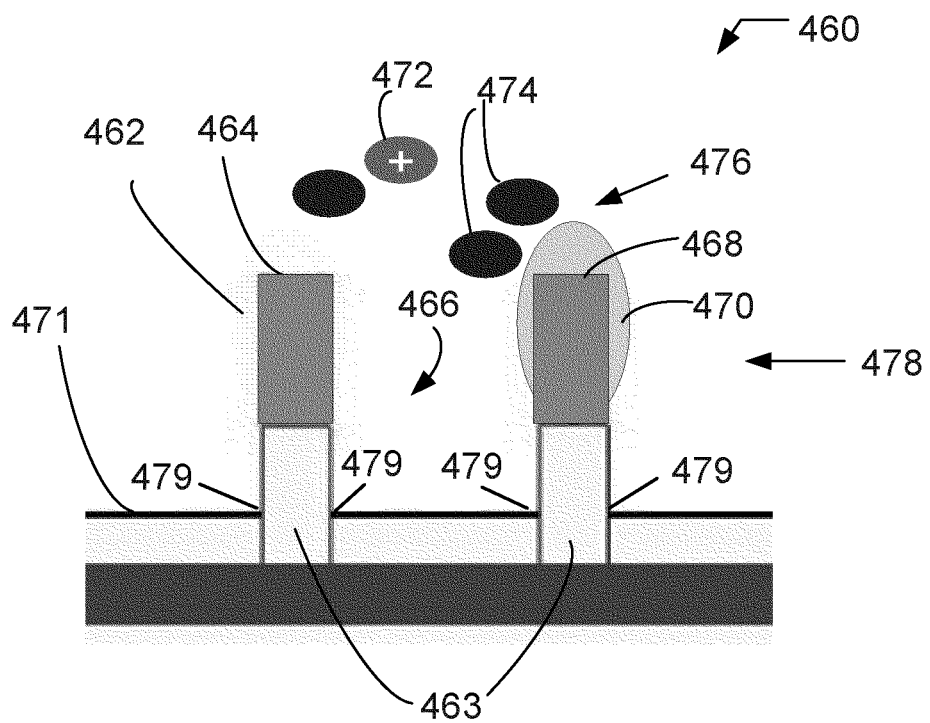
FIG. 4D is an exemplary schematic of a substrate after a soft-landing etch and overetch process in an embodiment of the present invention.

FIG. 4D is an exemplary side-view schematic 460 of a patterned structure 478 of a substrate 476 depicting lesser non-volatile byproducts or residue (not shown) in the corner 479 of intersections 466 of the patterns of line and space 463 and fin-shaped structure 471. The presence of the coating of residue, 462 and 470, around the top portion, 464 and 468, of the patterned structures 478 reduces the physical transparency of the residue (not shown) in the corners 479 of intersections 466 but the residue is less after each cleaning step. The trajectory of positive radicals 472 as opposed to neutrals 474 in the plasma is not be as limited as in the prior art case. Furthermore, as the cleaning and etching steps are reiterated, the space to get to the corners 479 or transparency of the intersections 466 gets better. The iterations of the sequence of cleaning and etching stops when the target integration objectives are met.

Figure 4E:
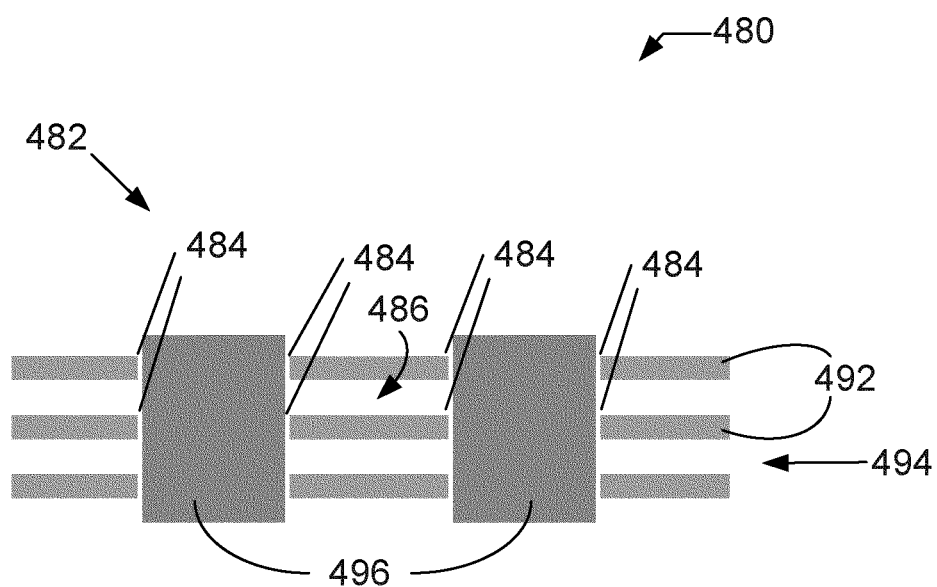
FIG. 4E is an exemplary schematic of a substrate depicting the absence of byproducts in the corners of intersections of patterns in gate etching in an embodiment of the present invention.

FIG. 4E is an exemplary schematic 480 of a substrate 482 depicting the absence of byproducts or residue in the corners 484 of intersections 486 of patterned structure 494 in gate structure 496 and the fin-shaped structure 492 in an embodiment of the present invention. The absence of residue and the vertical profile of corners 484 are the result of performing an iteration of cleaning and etching steps as described above. The cleaning step and etch step are performed iteratively until the target integration objectives including a target removal percentage of residue, no residue at gate-fin corners, target by-product redeposition, and target corner profile at intersections are achieved.

Figure 5A:
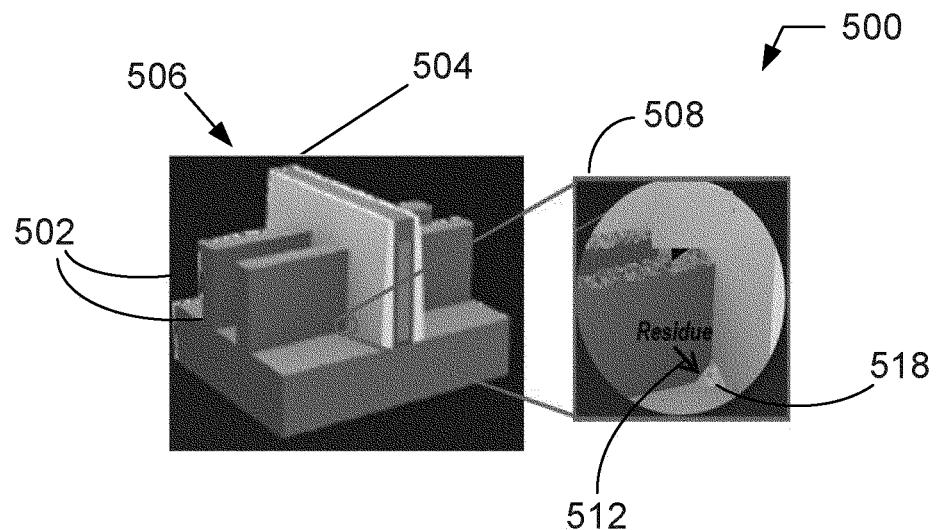
FIG. 5A is an exemplary three-dimensional schematic of a substrate depicting the presence of byproducts in the corners of intersections of the patterns and a schematic of a corner residue.

FIG. 5A is an exemplary three-dimensional schematic 500 of a substrate 506 depicting the presence of non-volatile byproducts or residue 512 in the corner 518 of intersections of the patterns of line and space 504 (gate or patterned structure) and fin-shaped structure 502. A schematic of a close-up 508 of residue 512 at the corner 518 of the intersections of the patterns of line and space 504 and fin-shaped structure 502 is also shown to highlight the position of and difficulty of reaching the residue 512 at the corner 518. As mentioned above, the height of the residue 512 is dwarfed by the relative height of both the fin-shaped structure 502 and the gate structure 504. The height of the surrounding features including the fin-shaped structure 502 and gate structure 504 are typically 10-100 times larger than that of the residue 512. Similarly, the width of the residue 512 is small in comparison to similar dimensions of fin-shaped structure 502 and the gate or patterned structure 504, so the aspect ratio when etching a particular residue 512 is very large, causing difficulty in etching the residue 512.

Figure 5B:
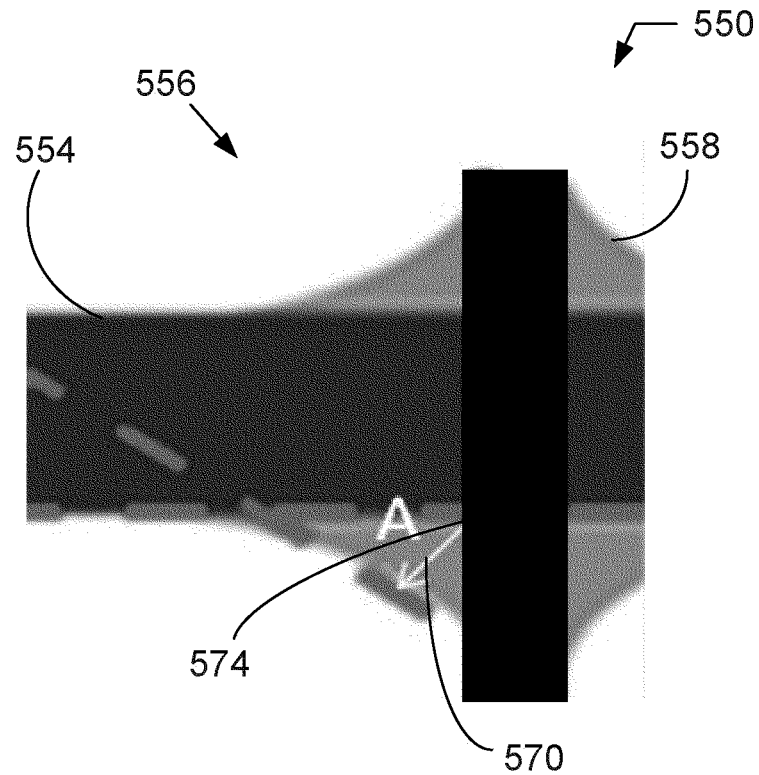
FIG. 5B is an exemplary top-view schematic of a substrate depicting the presence of byproducts in a corner of an intersection of the patterns and the relative size of the corner residue compared to the surrounding structure.

FIG. 5B is an exemplary top-view image 550 of a portion of a substrate 556 depicting the relative dimension of residue (not shown) in the corner of intersections of a fin-shaped structure 554. Line A 570 is a distance from the corner 574 of the fin-shaped structure 554 to the edge of the underlying layer 558. Typically, a residue (not shown) is a very small portion of line A 570 and reinforces the narrative in FIG. 5A of the actual relative size of the residue compared to surrounding structures. The aspect ratio of the surrounding structures to the residue is a critical factor in the difficulty of etching the residue and in achieving a vertical corner profile of the intersecting structures.

Figure 6A:
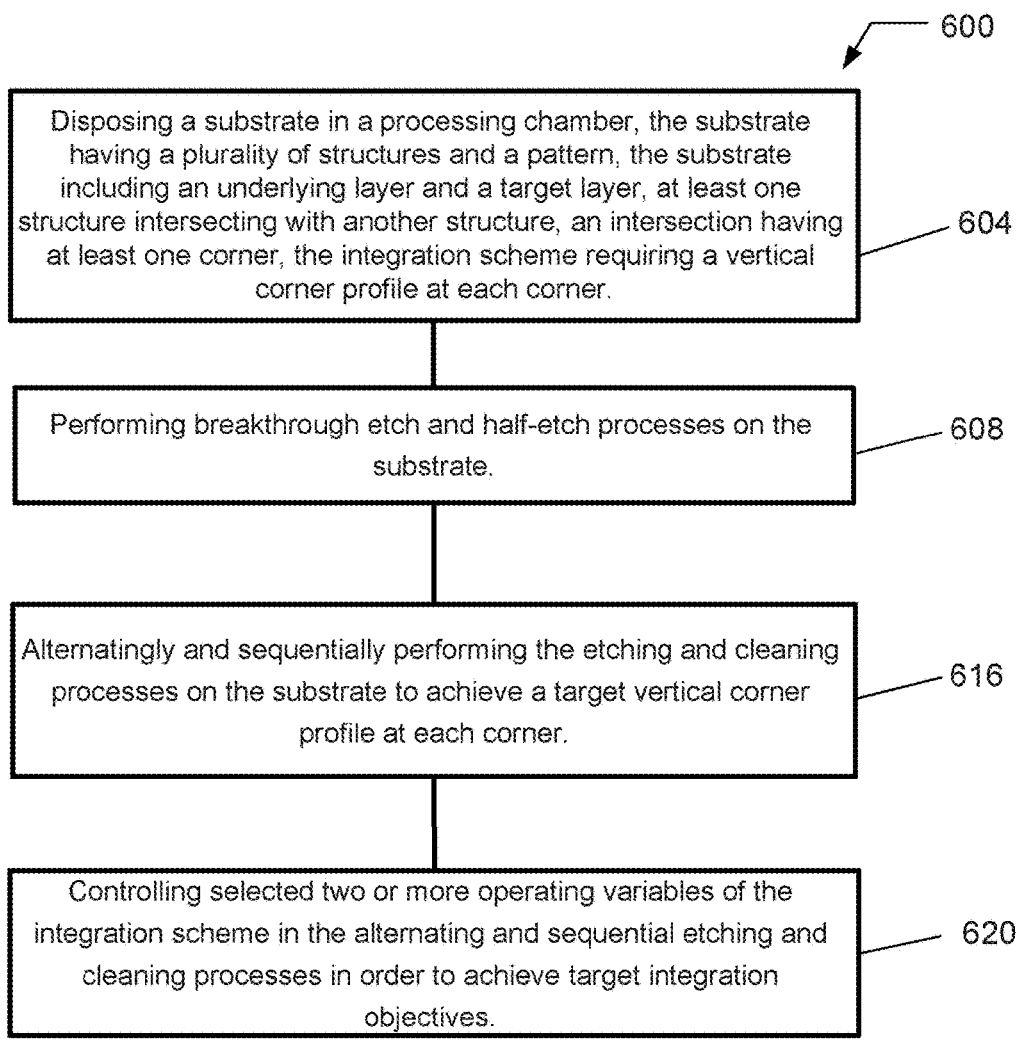
FIG. 6A is an exemplary process flow chart for a method of performing an integration process for a substrate with intersecting structures in an embodiment of the present invention.

FIG. 6A is an exemplary process flow chart 600 for a method of performing an integration process for a substrate with intersecting structures in an embodiment of the present invention. In operation 604, a substrate is disposed in a processing chamber, the substrate having a plurality of structures and a pattern, the substrate including an underlying layer and a target layer, at least one structure intersecting with another structure, each intersection having a corner, the integration scheme requiring a vertical corner profile at each intersection.

In operation 608, a breakthrough etch and half-etch processes are performed on the substrate. The details of the etching process are discussed previously in relation to FIG. 4C and shall not be repeated here. In operation 616, the etching and cleaning are alternatingly and sequentially performed on the substrate to transfer the pattern onto the target layer and to achieve a target vertical corner profile at each intersection. The etching process is similar to the process described in relation to FIG. 4D and shall not be repeated here. The plasma cleaning process is similar to the cleaning process discussed in relation to FIG. 4C and details of the process shall not be repeated here. The plasma cleaning process can use a fluorine-based plasma using one or more of HBr, $Cl_2$, $SF_6$, $CF_4$, $CHF_3$, or $CH_3F$. Other halogen gases such as chlorine-based gases may also be used.

In operation 620, selected two or more operating variables of the integration scheme are concurrently controlled in the breakthrough etch and half-etch processes and in the alternating and sequential etching and cleaning operations in order to achieve target integration objectives. The target removal percentage of residue can be a range of 90 to 100%.

Figure 6B:
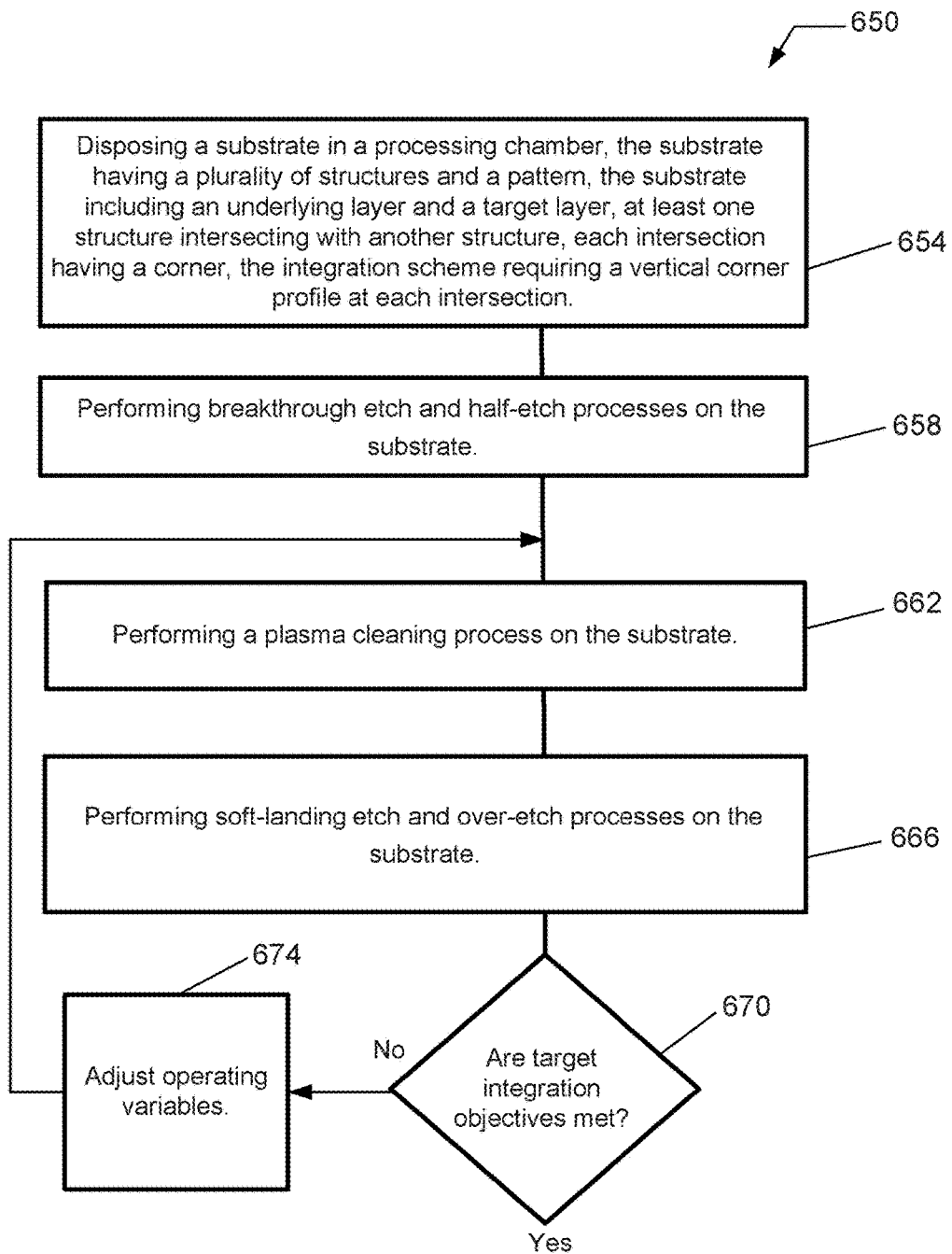
FIG. 6B is an exemplary process flow chart for another method of performing an integration process for a substrate with intersecting structures in an embodiment of the present invention.

FIG. 6B is an exemplary process flow chart 650 for another method of performing an integration process for a substrate with intersecting patterned structures in an embodiment of the present invention. In operation 654, a substrate is disposed in a processing chamber, the substrate having a plurality of patterned structures and a pattern, the substrate including an underlying layer and a target layer, at least one patterned structure intersecting with another patterned structure, each intersection having at least one corner, the integration scheme requiring a vertical corner profile at each intersection.

In operation 658 a breakthrough etch and half-etch processes are performed on the substrate. This is similar to operation 608 of FIG. 6A and detailed description of the operation shall not be repeated here. In operation 662, plasma cleaning process is performed on the substrate. The plasma cleaning process can use a fluorine-based plasma using one or more of HBr, $Cl_2$, $SF_6$, $CF_4$, $CHF_3$, or $CH_3F$. Other halogen gases such chlorine-based gases may also be used. In operation 666, a soft-landing etch and an overetch processes are performed on the substrate. This is similar to the process described in relation to FIG. 4C and shall not be repeated here.

In operation 670, if the target integration objectives are achieved, processing for the substrate is complete. Otherwise, in operation 674, operating variables are adjusted and the plasma cleaning process and the soft-landing etch and an overetch processes are iterated until the integration objectives are achieved. The number of iterations depend on flow rate of the etch gas mixtures, chamber temperature, length of process time, lower and higher electrode power, and others. The target removal percentage of residue can be a range of 90 to 100%.

The need for iterations of the plasma cleaning process and the soft-landing etch and an overetch processes can be determined by making measurements of the substrate using critical dimension scanning electron microscopy (CDSEM), cross-section SEM (XSEM), and the like. Alternatively, the measurements can be performed with inline in-situ metrology devices such as optical metrology devices which include reflectometers, ellipsometers, and the like, and optical emission spectroscopy devices. The measurements can be transmitted to a controller where adjustments to operating variables in the breakthrough etch and half-etch processes, plasma cleaning process, the soft-landing etch, and the overetch processes can be made before iterating the processing.

In an embodiment, the critical dimension (CD) of the patterned structure is measured after process completion and physical removal of the substrate from the process tool. If the CD is out of target, the number of steps and operating parameters adjustment can be made either automatically based on the etch model, etc., or manually by a process engineer or a tool operator.

Figure 7:
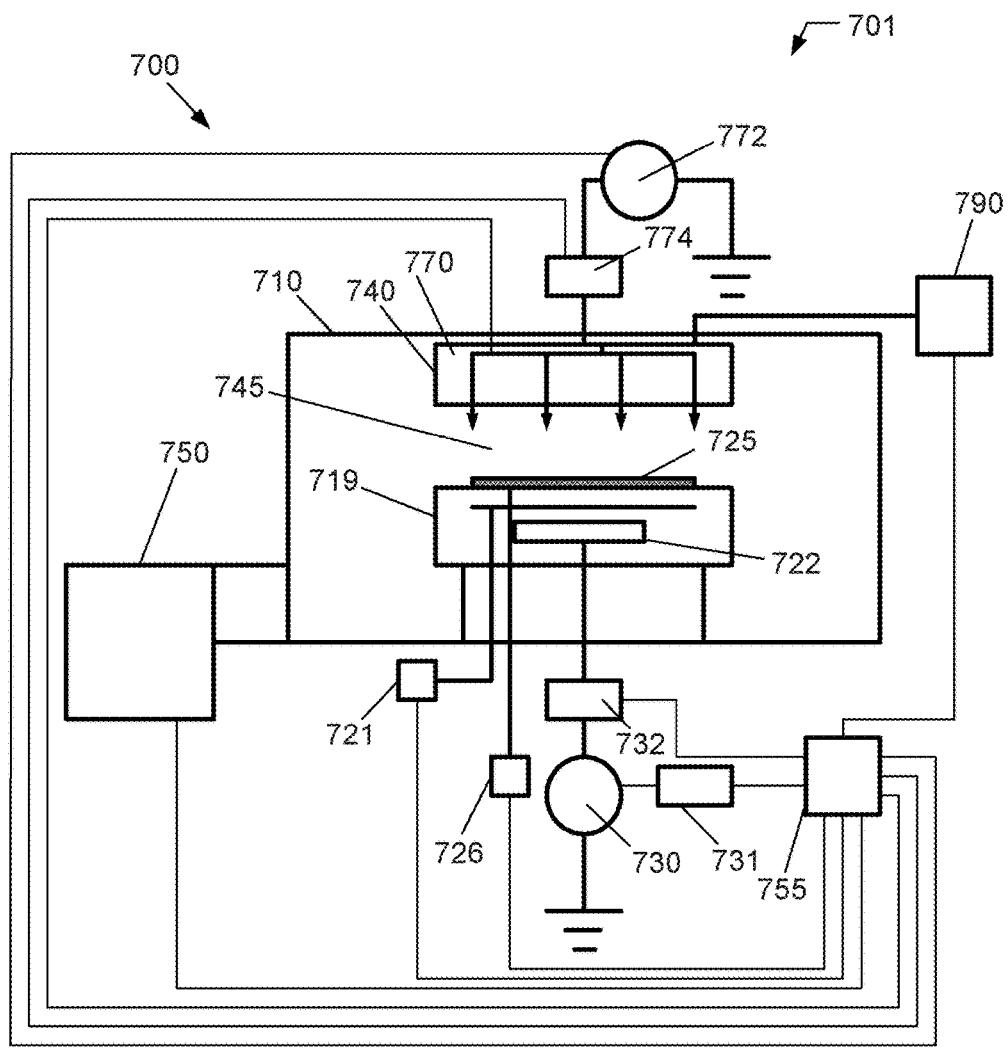
FIG. 7 is an exemplary systems chart depicting a controller of an integration system processing metrology data to facilitate process control of operations and achieve integration objectives.

FIG. 7 is an exemplary systems chart 701 of an integration scheme utilizing the patterning process in an embodiment of the present invention. A processing system 700 configured to perform the above identified process conditions is depicted in FIG. 7 comprising a processing chamber 710, substrate holder 719, upon which a substrate 725 to be processed is affixed, and vacuum pumping system 750. Substrate 725 can be a semiconductor substrate, a substrate, a flat panel display, or a liquid crystal display. Processing chamber 710 can be configured to facilitate etching the processing region 745 in the vicinity of a surface of substrate 725. An ionizable gas or mixture of process gases is introduced via a gas distribution system 740. For a given flow of process gas, the process pressure is adjusted using the vacuum pumping system 750. The processing can aid the removal of material from the exposed surfaces of substrate 725. The processing system 700 can be configured to process substrates of any desired size, such as 190 mm substrates, 300 mm substrates, or larger.

Substrate 725 can be affixed to the substrate holder 719 via a clamping system 728, such as a mechanical clamping system or an electrical clamping system (e.g., an electrostatic clamping system). Furthermore, substrate holder 719 can include a heating system (not shown) or a cooling system (not shown) that is configured to adjust and/or control the temperature of substrate holder 719 and substrate 725. The heating system or cooling system may comprise a re-circulating flow of heat transfer fluid that receives heat from substrate holder 719 and transfers heat to a heat exchanger system (not shown) when cooling, or transfers heat from the heat exchanger system to substrate holder 719 when heating. In other embodiments, heating/cooling elements, such as resistive heating elements, or thermo-electric heaters/coolers can be included in the substrate holder 719, as well as the chamber wall of the processing chamber 710 and any other component within the processing system 700.

Additionally, a heat transfer gas can be delivered to the backside of substrate 725 via a backside gas supply system 726 in order to improve the gas-gap thermal conductance between substrate 725 and substrate holder 719. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 725.

In the embodiment shown in FIG. 7, substrate holder 719 can comprise an upper electrode 770 and a lower electrode 722 through which RF power is coupled to the processing region 745. For example, substrate holder 719 can be electrically biased at a RF voltage via the transmission of RF power from a RF generator 730 through an optional impedance match network 732 to substrate holder 719. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 80 MHz. RF systems for plasma processing are well known to those skilled in the art.

Furthermore, the electrical bias of electrode 722 at an RF voltage may be pulsed using pulsed bias signal controller 731. The RF power output from the RF generator 730 may be pulsed between an off-state and an on-state, for example. Alternately, RF power is applied to the substrate holder electrode at multiple frequencies. Furthermore, impedance match network 732 can improve the transfer of RF power to plasma in plasma processing chamber 710 by reducing the reflected power. Match network topologies (e.g. L-type, Pi-type, T-type, etc.) and automatic control methods are well known to those skilled in the art.

Gas distribution system 740 may comprise a showerhead design for introducing a mixture of process gases. Alternatively, gas distribution system 740 may comprise a multi-zone showerhead design for introducing a mixture of process gases and adjusting the distribution of the mixture of process gases above substrate 725. For example, the multi-zone showerhead design may be configured to adjust the process gas flow or composition to a substantially peripheral region above substrate 725 relative to the amount of process gas flow or composition to a substantially central region above substrate 725 or split into a center flow and an edge flow.

Vacuum pumping system 750 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 litter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 710.

As mentioned above, the controller 755 can comprise a microprocessor, memory, and a digital I/O port capable of generating control voltages sufficient to communicate and activate inputs to processing system 700 as well as monitor outputs from plasma processing system 700. Moreover, controller 755 can be coupled to and can exchange information with RF generator 730, pulsed bias signal controller 731, impedance match network 732, the gas distribution system 740, the gas supply 790, vacuum pumping system 750, as well as the substrate heating/cooling system (not shown), the backside gas supply system 726, and/or the electrostatic clamping system 721. For example, a program stored in the memory can be utilized to activate the inputs to the aforementioned components of processing system 700 according to a process recipe in order to perform a plasma assisted process, such as a plasma etch process or a PHT process, on substrate 725.

In addition, the processing system 700 can further comprise an upper electrode 770 to which RF power can be coupled from RF generator 772 through optional impedance match network 774. A frequency for the application of RF power to the upper electrode can range from about 0.1 MHz to about 80 MHz. Additionally, a frequency for the application of power to the lower electrode can range from about 0.1 MHz to about 80 MHz. Moreover, controller 755 is coupled to RF generator 772 and impedance match network 774 in order to control the application of RF power to upper electrode 770. The design and implementation of an upper electrode is well known to those skilled in the art. The upper electrode 770 and the gas distribution system 740 can be designed within the same chamber assembly, as shown. Alternatively, upper electrode 770 may comprise a multi-zone electrode design for adjusting the RF power distribution coupled to plasma above substrate 725. For example, the upper electrode 770 may be segmented into a center electrode and an edge electrode.

Depending on the applications, additional devices such as sensors or metrology devices can be coupled to the processing chamber 710 and to the controller 755 to collect real time data and use such real time data to concurrently control two or more selected integration operating variables in two or more steps involving deposition processes, RIE processes, pull processes, pattern reformation processes, heating treatment processes and/or pattern transfer processes of the integration scheme. Furthermore, the same data can be used to ensure integration targets including completion of post heat treatment (PHT), patterning uniformity (uniformity), pulldown of patterned structure (pulldown), slimming of patterned structure (slimming), aspect ratio of patterned structure (aspect ratio), etch selectivity, line edge roughness (LER), line width roughness (LWR), substrate throughput, cost of ownership, and the like are achieved.

Other plasma processing systems can be used, the description of such systems can be found in U.S. Pat. No. 9,443,731 entitled "Material processing to achieve sub-10 nm patterning", issued on Sep. 13, 2016; the content of which is herein incorporated by reference in its entirety.

Although only certain embodiments of this invention have been described in detail above, those skilled in the art will readily appreciate that many modifications are possible in the embodiments without materially departing from the novel teachings and advantages of this invention. Although the silicon etch and fluorine-based cleaning process embodiment is used to explain the principles, features, and benefits of the present invention, as mentioned above, the invention can be used for substrates with other patterned structure layers that can include one or more intersections requiring a near vertical or vertical corner profile. Accordingly, all such modifications are intended to be included within the scope of this invention.

What is claimed:

1. A method of patterning structures on a substrate using an integration scheme in a patterning system, the method comprising:
    disposing a substrate in a processing chamber, the substrate having a plurality of patterned structures and a pattern, the substrate including an underlying layer and a target layer, at least one of the patterned structures intersecting with another one of the patterned structures, each intersection having at least one corner and an intersection angle, the corner having a corner profile;
    performing breakthrough etch and half-etch processes on the patterned structures on the substrate, the breakthrough etch and half-etch processes causing residue at the corners;
    alternatingly and sequentially performing etching and cleaning processes on the substrate to transfer the pattern onto the target layer and to achieve a target vertical corner profile at each intersection, the cleaning process configured to increase a physical transparency of a lower portion of the patterned structures to plasma radicals;
    controlling selected two or more operating variables of the integration scheme in the alternating and sequential etching and cleaning processes in order to achieve target integration objectives.

2. The method of claim 1 wherein the target integration objectives include a target removal percentage of the residue and the target vertical corner profile at the intersections.

3. The method of claim 2 wherein the target removal percentage of the residue is in a range from 90 to 100%.

4. The method of claim 1 wherein the alternating and sequential etching includes etching with a halogen plasma.

5. The method of claim 4 wherein the halogen plasma is bromine-based or chlorine-based plasma.

6. The method of claim 5 wherein the bromine-based plasma creates a non-volatile byproduct $SiBr_xO_y$, and wherein x and y are non-zeros; or wherein the chlorine-based plasma creates a non-volatile byproduct $SiCl_xO_y$ and wherein x and y are non-zeros.

7. The method of claim 1 wherein the alternating and sequential etching includes a soft landing etch and an overetch with operating variables that include a source power in a range of 1 to 3,000 W, bias power in the range from 0 to 1,000 W, pressure in a range from 3 to 500 mT; gas flow rates in a range from 1 sccm to 5,000 sccm.

8. The method of claim 1 wherein the intersection angle is substantially 90 degrees or wherein the intersection angle is in the range from 1 to 179 degrees.

9. The method of claim 1:
    wherein in-situ metrology devices configured to measure the target corner profile of the intersections of structures and/or the residue in the corners of the intersections are transmitted to a controller in order to make adjustments to the two or more operating variables of the alternating and sequential etching and cleaning processes.

10. The method of claim 1 wherein the plurality of structures in the substrate include fin-shaped field effect transistors (FINFET).

11. The method of claim 1 wherein the target layer is a fin layer of a FINFET device.

12. The method of claim 1 wherein there are two or more intersecting structures.

13. The method of claim 12 wherein the two or more intersecting structures comprise two continuous line structures and three segmented line structures of a FINFET device.

14. The method of claim 13 wherein the two continuous line structures are gates having enclosed cavities and the three segmented line structures outside of the enclosed cavities are fins of the FINFET device.

15. The method of claim 1 wherein removal of the residue during the alternating and sequential etching and cleaning processes increases transparency at the corners of the target layer in order to create the vertical corner profile required at each intersection of the patterned structures in the substrate.

16. A method of patterning structures on a substrate using a patterning scheme in a patterning system, the method comprising:
    disposing a substrate in a processing chamber, the substrate including an underlying layer and a target layer, at least one structure intersecting with another structure, each intersection having an intersection angle and a vertically extending corner, the substrate further including a pattern requiring a vertical corner profile at each intersection;
    performing breakthrough etch and half-etch processes on the structures on the substrate, the breakthrough etch and half-etch processes causing residue at the corners;
    performing a plasma cleaning process on the substrate;
    performing a soft-landing etch process and an overetch process on the substrate;
    making measurements of the substrate and determining if target integration objectives are met; and
    if target integration objectives are not met, adjusting one or more operating variables of the plasma cleaning process and the soft-landing etch and overetch processes and repeating the performance of the plasma cleaning process and the soft-landing etch and overetch processes until the target integration objectives are met.

17. The method of claim 16 wherein the target integration objectives include a target removal percentage of the residue and the required vertical corner profile at the intersections.

18. The method of claim 17 wherein the removal percentage of the residue is in a range from 90 to 100%.

19. The method of claim 18:
    wherein in-situ metrology devices configured to measure the corner profile of the intersections of structures and/or the residue in the corners of the intersections are transmitted to a controller in order to make adjustments to the one or more operating variables of the plasma cleaning process and the soft-landing etch and overetch processes.

* * * * *

UNITED STATES PATENT AND TRADEMARK OFFICE
CERTIFICATE OF CORRECTION

PATENT NO. : 10,204,832 B2
APPLICATION NO. : 15/708319
DATED : February 12, 2019
INVENTOR(S) : Sergey A. Voronin et al.

It is certified that error appears in the above-identified patent and that said Letters Patent is hereby corrected as shown below:

In the Specification

Column 6, Lines 18-19, change "Other halogen gases such chlorine-based gases may also be used." to --Other halogen gases such as chlorine-based gases may also be used.--.

Column 6, Line 27, change "gases reacting with oxygen can result in formation $SiBr_xO_y$" to --gases reacting with oxygen can result in formation of $SiBr_xO_y$--.

Column 6, Line 65, change "oxygen represented as SiBrxO$_y$." to --oxygen represented as $SiBr_xO_y$--.

Column 7, Lines 12-13, change "the hard masks, 444 and 448, and intersection 446, The hard masks has a" to --the hard masks, 444 and 448, and intersection 446. The hard masks have a--.

Column 9, Line 11, change "Other halogen gases such chlorine-based gases may also be" to --Other halogen gases such as chlorine-based gases may also be--.

Signed and Sealed this
Ninth Day of July, 2019

Andrei Iancu
*Director of the United States Patent and Trademark Office*